(12) United States Patent
Hatcher et al.

(10) Patent No.: US 11,101,320 B2
(45) Date of Patent: Aug. 24, 2021

(54) SYSTEM AND METHOD FOR EFFICIENT ENHANCEMENT OF AN ON/OFF RATIO OF A BITCELL BASED ON 3T2R BINARY WEIGHT CELL WITH SPIN ORBIT TORQUE MJTS (SOT-MTJS)

(71) Applicant: Samsung Electronics Co., Ltd., Gyeonggi-do (KR)

(72) Inventors: Ryan Hatcher, Austin, TX (US); Titash Rakshit, Austin, TX (US); Jorge Kittl, Garland, TX (US); Rwik Sengupta, Austin, TX (US); Dharmendar Palle, Austin, TX (US); Joon Goo Hong, Austin, TX (US)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/850,691

(22) Filed: Apr. 16, 2020

(65) Prior Publication Data

US 2021/0118950 A1 Apr. 22, 2021

Related U.S. Application Data

(60) Provisional application No. 62/924,428, filed on Oct. 22, 2019.

(51) Int. Cl.
| | | |
|---|---|---|
| *G11C 11/15* | (2006.01) | |
| *H01L 27/22* | (2006.01) | |
| *G11C 11/16* | (2006.01) | |
| *G11C 13/00* | (2006.01) | |
| *H01F 10/32* | (2006.01) | |
| *H01L 43/02* | (2006.01) | |
| *H01L 27/24* | (2006.01) | |

(52) U.S. Cl.
CPC .......... *H01L 27/228* (2013.01); *G11C 11/161* (2013.01); *G11C 11/1673* (2013.01);
(Continued)

(58) Field of Classification Search
CPC ... H01L 27/228; H01L 43/02; H01L 27/2436; G11C 11/1673; G11C 13/004;
(Continued)

(56) References Cited

U.S. PATENT DOCUMENTS 7,054,186 B2 5/2006 Iwata
7,885,095 B2 2/2011 Sakimura et al.
(Continued)

FOREIGN PATENT DOCUMENTS

WO WO 2018136003 7/2018

OTHER PUBLICATIONS

T. Yang, K. Li, Y. Chiang, W. Lin, H. Lin and M. Chang, "A 28nm 32Kb embedded 2T2MTJ STT-MRAM macro with 1.3ns read-access time for fast and reliable read applications," 2018 IEEE International Solid—State Circuits Conference—(ISSCC), San Francisco, CA, 2018, pp. 482-484.

(Continued)

*Primary Examiner* — Mushfique Siddique
(74) *Attorney, Agent, or Firm* — The Farrell Law Firm, P.C.

(57) ABSTRACT

A weight cell, an electronic device and a device are provided. The weight cell includes a first resistive memory element and a second resistive memory element, a select transistor, and a layer of Spin Hall (SH) material disposed between the first resistive memory element and the second resistive memory element, the layer of the SH material including a first contact and a second contact. The first contact of the SH material is connected to a drain of the select transistor and the second contact of the SH material is connected to an external word line.

19 Claims, 4 Drawing Sheets

(52) U.S. Cl.
CPC ........ *G11C 11/1675* (2013.01); *G11C 13/004* (2013.01); *G11C 13/0069* (2013.01); *H01F 10/329* (2013.01); *H01F 10/3259* (2013.01); *H01L 27/2436* (2013.01); *H01L 43/02* (2013.01); *G11C 2013/0045* (2013.01); *G11C 2013/0078* (2013.01)

(58) Field of Classification Search
CPC .............. G11C 13/0069; G11C 11/161; G11C 11/1675; G11C 2013/0045; G11C 2013/0078; H01F 10/3259; H01F 10/329
See application file for complete search history.

(56) References Cited

U.S. PATENT DOCUMENTS

| | | |
|---|---|---|
| 9,858,975 B1 | 1/2018 | Hatcher |
| 10,127,961 B2 | 11/2018 | Appeltans et al. |
| 2015/0036415 A1* | 2/2015 | Di Pendina ......... G11C 11/1675 365/148 |
| 2015/0269478 A1* | 9/2015 | Datta ..................... G11C 11/18 706/33 |
| 2017/0200499 A1* | 7/2017 | Rakshit .............. G11C 14/0081 |
| 2018/0114898 A1 | 4/2018 | Lee |
| 2019/0392881 A1* | 12/2019 | Rakshit ................. G06N 3/063 |
| 2020/0005844 A1* | 1/2020 | Alhalabi ............. G11C 11/1675 |
| 2020/0075099 A1* | 3/2020 | Choi .................... G11C 11/1675 |
| 2020/0241840 A1* | 7/2020 | Ikegami ................. G06F 7/383 |

OTHER PUBLICATIONS

J. Ryu and K. Kwon, "A Reliable 2T2MTJ Nonvolatile Static Gain Cell STT-MRAM With Self-Referencing Sensing Circuits for Embedded Memory Application," in IEEE Transactions on Magnetics, vol. 52, No. 4, pp. 1-10, Apr. 2016, Art No. 3400310.

\* cited by examiner

SYSTEM AND METHOD FOR EFFICIENT ENHANCEMENT OF AN ON/OFF RATIO OF A BITCELL BASED ON 3T2R BINARY WEIGHT CELL WITH SPIN ORBIT TORQUE MJTS (SOT-MTJS)

PRIORITY

This application is based on and claims priority under 35 U.S.C. § 119(e) to U.S. Provisional Patent Application filed on Oct. 22, 2019 in the United States Patent and Trademark Office and assigned Ser. No. 62/924,428, the entire contents of which are incorporated herein by reference.

FIELD

The present disclosure is generally related to embedded resistive memories and, in particular, circuits with an array of weight cells having resistive memory elements.

BACKGROUND

There is an increasing demand for hardware accelerators for machine learning (ML) applications. The computations that dominate many of these ML applications are matrix vector multiplications. It is possible to do matrix vector multiplication very efficiently in analog through a crossbar network. However, in order to represent the weight, some kind of memory element must be introduced in each weight cell. Static random access memory (SRAM) is large and power inefficient. Nonvolatile memory options such as resistive random access memory (RRAM), FLASH or spin-torque transfer magnetic random access memory (STT-MRAM) often suffer from a subset of other challenges including low on/off ratios and non-compatible programming voltages.

SUMMARY

According to one embodiment, a weight cell includes a first resistive memory element and a second resistive memory element, a select transistor, and a layer of Spin Hall (SH) material disposed between the first resistive memory element and the second resistive memory element, the layer of the SH material including a first contact and a second contact. The first contact of the SH material is connected to a drain of the select transistor and the second contact of the SH material is connected to an external word line.

According to one embodiment, an electronic device includes an array of weight cells, each weight cell including a first resistive memory element and a second resistive memory element, a select transistor, and a layer of SH material disposed between the first resistive memory element and the second resistive memory element, the layer of the SH material including a first contact and a second contact, where the first contact of the SH material is connected to a drain of the select transistor and the second contact of the SH material is connected to an external word line. The electronic device includes a processor configured to perform inference with the array of weight cells by setting inputs for a row of weight cells from among the array of weight cells according to a logical value of a corresponding neuron and reading outputs of a column of weight cells from among the array of weight cells.

According to one embodiment, a device includes an array of weight cells, each weight cell including a first resistive memory element and a second resistive memory element, a select transistor, and a layer of SH material disposed between the first resistive memory element and the second resistive memory element, the layer of the SH material including a first contact and a second contact, where the first contact of the SH material is connected to a drain of the select transistor and the second contact of the SH material is connected to an external word line. The device includes a processor configured to write to the resistive memory elements according to a direction of a supplied current.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
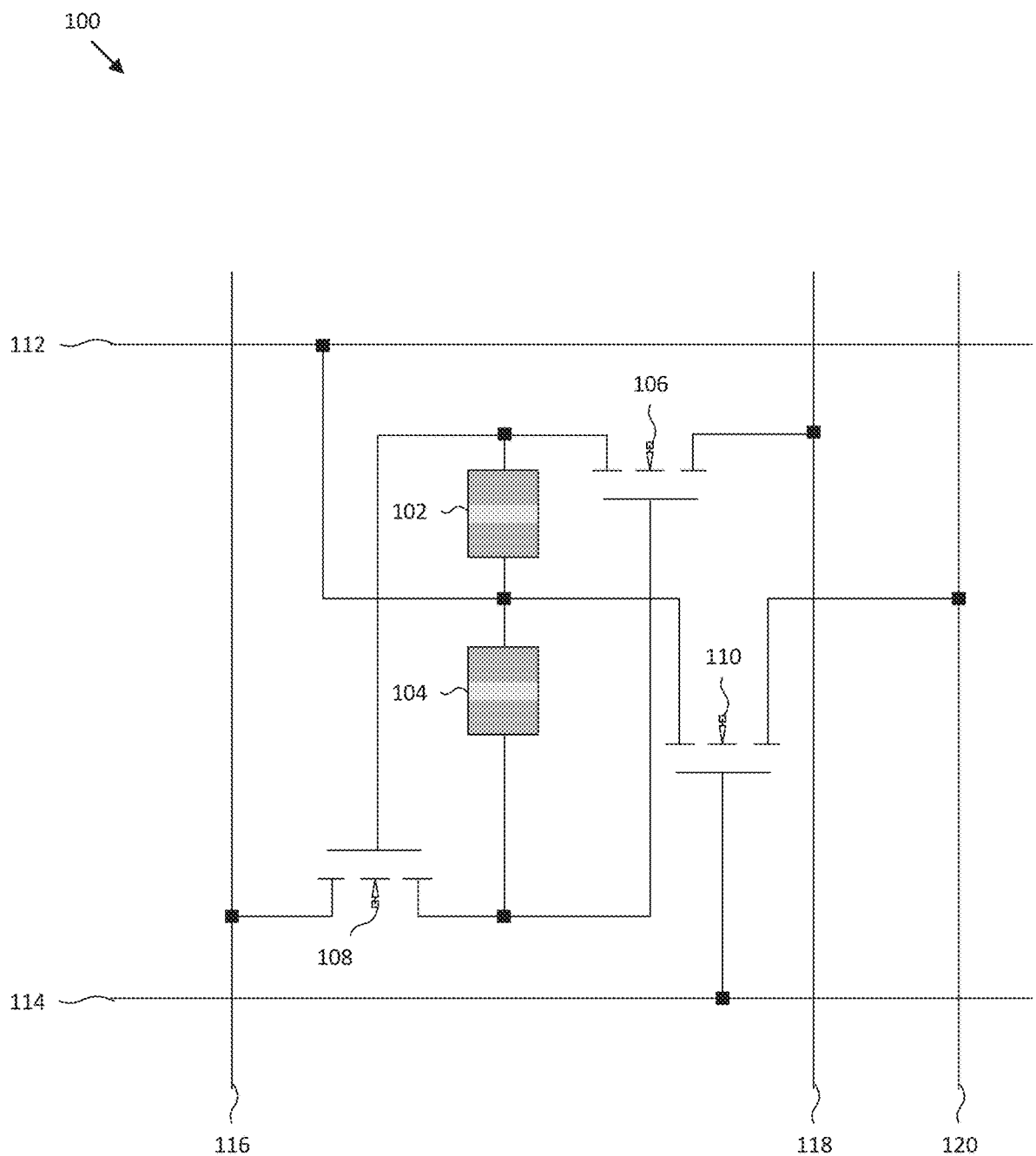
FIG. 1 illustrates a diagram of a 3T-2R weight cell, according to an embodiment.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

The electronic device according to one embodiment may be one of various types of electronic devices. The electronic devices may include, for example, a portable communication device (e.g., a smart phone), a computer, a portable multimedia device, a portable medical device, a camera, a wearable device, or a home appliance. According to one embodiment of the disclosure, an electronic device is not limited to those described above.

The terms used in the present disclosure are not intended to limit the present disclosure but are intended to include various changes, equivalents, or replacements for a corresponding embodiment. With regard to the descriptions of the accompanying drawings, similar reference numerals may be used to refer to similar or related elements. A singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, terms such as "$1^{st}$," "2nd," "first," and "second" may be used to distinguish a corresponding component from another component, but are not intended to limit the components in other aspects (e.g., importance or order). It is intended that if an element (e.g., a first element) is referred to, with or without the term "operatively" or "communicatively", as "coupled with," "coupled to," "connected with," or "connected to" another element (e.g., a second element), it indicates that the element may be coupled with the other element directly (e.g., wired), wirelessly, or via a third element.

As used herein, the term "module" may include a unit implemented in hardware, software, or firmware, and may interchangeably be used with other terms, for example, "logic," "logic block," "part," and "circuitry." A module may be a single integral component, or a minimum unit or part thereof, adapted to perform one or more functions. For example, according to one embodiment, a module may be implemented in a form of an application-specific integrated circuit (ASIC).

In accordance with an aspect of the disclosure, a system and method are provided for efficient enhancement of an on/off ratio of a bitcell based on spin orbit torque MTJs (SOT-MTJs). A resistive weight cell for semi-digital matrix vector multiplication is described herein including two SOT-MTJs in a single stack, and three N-type field effect transistors. The SOT-MTJ stack includes one SOT-MTJ on top of the other with the same thin Spin-Hall (SH) material adjacent to the free layers of both MTJs (the free layer of the bottom MTJ is on top and the free layer of the top MTJ is on the bottom). In this configuration, a transverse current through the SH material will simultaneously program both MTJs in the opposite states (one high conductance and one low conductance). The direction of the current determines specifically which MTJ will be in the high conductance state and which will be in the low conductance state. The ratio of the on resistance to the off resistance is relatively low for SOT-MRAM (about 2-3).

The system and method may include a weight cell configuration where the on/off ratio is closer to that of the transistor ($10^4$-$10^5$). Furthermore, the weight cell produces complementary output on two lines, output and $\overline{\text{output}}$. If the product of the input signal and the weight cell weight is a logical 1, then the output line will have a constant non-zero current and the $\overline{\text{output}}$ line will have effectively zero current. Conversely, if the product is a logical 0, then the output line will have effectively zero current and the $\overline{\text{output}}$ line will have a constant non-zero current.

The system and method may provide a bitcell including two resistive memory elements that are written with currents transverse to one of the contacts (e.g. SOT-MRAM) and three metal-oxide semiconductor field-effect transistors (MOSFETs). A resistive memory element is connected in series with the drain of a MOSFET. A select transistor may be added that allows a transverse current to program the memory element. Another feature is the cross coupling in the circuit between the drain of one transistor and the gate of the other and vice versa. Additionally, five external connections to the bitcell are provided, which are independently controlled during inference and write operations.

FIG. 1 illustrates a diagram of a 3T-2R weight cell, according to an embodiment. The weight cell 100 includes two SOT-MTJs 102 and 104 configured in the same stack and three n-type field effect transistors (NFETs) 106, 108 and 110, along with five external connections 112, 114, 116, 118 and 120. The two SOT-MTJs 102 and 104 are referred to herein as variable resistors labelled MTJ and $\overline{\text{MTJ}}$.

Figure 2:
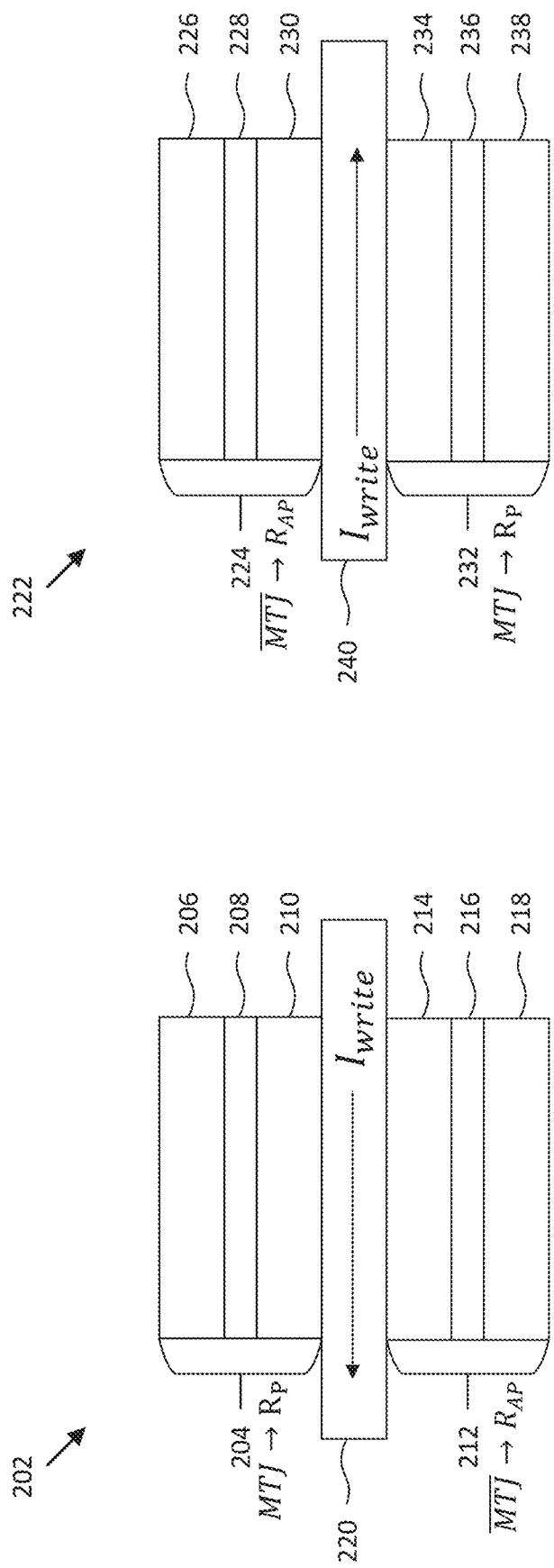
FIGS. 2A and 2B illustrate diagrams of bitcells with magneto tunnel junctions (MTJs) and Spin Hall (SH) layers, according to an embodiment.

FIGS. 2A and 2B illustrate diagrams of bitcells with MTJs and SH layers, according to an embodiment. Each MTJ can be in one of two states, either a high resistance state, $R_{AP}$, where the free layer is anti-parallel to the pinned layer, or a low resistance state, $R_P$, where the free layer is parallel to the pinned layer. To program the stack into a logical 1 or 0 state, the system and method apply a write potential so that a sufficiently large current either flows left to right or right to left.

In FIG. 2A, the bitcell 200 includes an MTJ 204 having a magnetically pinned reference layer 206, and a barrier layer (for example, comprising MgO) 208 and a magnetically reversible free layer 210, an $\overline{\text{MTJ}}$ 212 including a magnetically reversible free layer 214, a barrier layer 216 and a magnetically pinned layer 218, and an Spin-Hall layer 220 positioned between the MTJs. In the bitcell 200, the current flows to the left, resulting in MTJ 204 having a low resistance state and $\overline{\text{MTJ}}$ 214 having a high resistance state.

In FIG. 2B, the bitcell 222 includes an MTJ 224 having a magnetically pinned layer 226, and a barrier layer (e.g., an MgO layer) 228 and a magnetically reversible free layer 230, an $\overline{\text{MTJ}}$ 232 including a magnetically reversible free layer 234, a barrier layer 236 and a magnetically pinned layer 238, and a Spin-Hall layer 240 positioned between the MTJs. In the bitcell 222, the current flows to the right, resulting in MTJ 204 having a high resistance state and $\overline{\text{MTJ}}$ 214 having a low resistance state.

One skilled in the art will recognize that the MTJs described above are simple examples providing basic functionality; and may also be made with additional layers, or that the direction of the current through the SH material may result in reversed programming, depending on the materials and orientations used. Additionally, one skilled in the art will recognize that additional layers may be utilized with the MTJs described above, such as additional capping layers, reference layers, barrier layers, free layers, and spacer layers. An MTJ cell may include two terminals, with one terminal being in connection with an SOT layer and one terminal being in connection at a far end of the MTJ cell to a final layer (e.g., a capped layer).

Referring to FIG. 1, one contact to the SH material is disposed between the two free layers of MTJ and $\overline{MTJ}$ 102 and 104, and is connected to the external word line WL 112. The other contact is connected to the drain of the select transistor, S 110. The gate of the select transistor 110 is connected to the external select line SL 114. The source of S of the select transistor 110 is connected to the external programming line PL 120. The contact to the pinned layer of MTJ 102 is connected to the drain of the N transistor 106 and to the gate of the $\overline{N}$ transistor 108. The source of the N transistor 106 is connected to the external bit line BL 118. Conversely, the other contact to the pinned layer of $\overline{MTJ}$ 104 is connected both to the drain of the $\overline{N}$ transistor 108 and the gate of the N transistor 106. The source of the N transistor 108 is connected to the external bit line bar, $\overline{BL}$ 116.

To provide a high on/off ratio of the output, the system and method cross couple the drain of one NFET to the gate of the other and vice versa. In addition, the MTJ's should have different conductance states (in some embodiments, this is provided for by the nature of the SOT-2MTJ stack described above—since such a stack always results in MTJs with opposite programmings) and the configuration determines the logical value of the cell. The cell has a logical value of 1 if MTJ 102 is in the high resistance state, $R_{AP}$, and $\overline{MTJ}$ 104 is in a low resistance state, $R_P$. The cell has a logical value of 0 if MTJ 102 is in the low resistance state, $R_P$, and $\overline{MTJ}$ 104 is in a high resistance state, $R_{AP}$.

During inference, the weight cell performs a multiplication operation in analog based on the potential applied to WL 112 and the state of the weight cell. The product is an analog current on the BL output line 118 and a controlled complementary output on the $\overline{BL}$ 116. The external lines BL 116 and $\overline{BL}$ 118 are held at ground. The logical value of the input is determined by the potential applied to WL 112. If WL 112 is set high, then the input has a logical value of 1. If WL 112 is set low, then the input has a logical value of 0. The state of the weight cell is determined by the conductance states of the two MTJ's as described above and shown in Table 1 below.

TABLE 1

| Logical Input | WL | Logical Weight | MTJ | $\overline{MTJ}$ | BL | $\overline{BL}$ |
| --- | --- | --- | --- | --- | --- | --- |
| 0 | 0 | 0 | $R_{AP}$ | $R_P$ | 0 | 0 |
| 0 | 0 | 1 | $R_P$ | $R_{AP}$ | 0 | 0 |
| 1 | $V_r$ | 0 | $R_{AP}$ | $R_P$ | 0 | $I_r$ |
| 1 | $V_r$ | 1 | $R_P$ | $R_{AP}$ | $I_r$ | 0 |

The mapping of logical values of the input and weight are shown in terms of the potential applied to WL 112 and the conductance states of the MTJs 102 and 104, respectively. For logical input values of 1, the potential $V_r$ applied to the input lines corresponds to a value suitable for reads and below that which would result in a write disturb fault but above the threshold voltage of the transistors. The outputs are given in terms of the currents put on the output lines. The output current is either zero or equal to $$I_r \equiv \frac{V_r}{R_{AP}},$$

in the limit of no leakage current and zero on state series resistance of the pass transistors, respectively.

To perform inference with an array of the proposed weights, the inputs for each row are set according to the logical value of the corresponding neuron. The output lines are then read in parallel along each column and the total current on the BL output is measured and divided by $I_r$ to obtain the product of the binary multiplication between the N input neurons and the N binary weights in a given column. In addition, the dot product may be extracted independently from the current on the $\overline{BL}$ line, if the number of logical 1's in the vector of inputs, M≤N, are known. The dot product is then equal to $$(N-M)\frac{I_{\overline{BL}}}{I_r}.$$

Writing to a given cell may be performed in separate steps depending on whether the MTJs are being written with a "left" or "right" current, which is defined as the direction of the current with respect to the circuit in FIGS. 2A and 2B. The array is written row-by-row and in two steps per row. To provide a row for programming, the SL line is set to a potential, $V_{en}$, that enables the select transistor in that row and set all other SL's to all the other rows to ground. In one step, the columns that are to be written with a "left" current are programmed by setting the WL in each row to ground, BL and $\overline{BL}$ in every column to ground, the PL in those columns that are to be written left are set to the write voltage, $V_w$, and all the remaining columns are set to $V_w$. In another step, the columns that are to be written with a "right" current are programmed by setting the WL in the row to $V_w$, the WL in the remaining rows to ground, BL and $\overline{BL}$ in every column to $V_w$, the PL in those columns that are to be written left are set to ground and the remaining columns set to the write voltage, $V_w$. Examples of the write operations are shown in Table 2 below.

TABLE 2

| | Row to be programmed | | All other Rows | | Column to be programmed | | All other columns | |
| --- | --- | --- | --- | --- | --- | --- | --- | --- |
| | SL | WL | SL | WL | PL | BL/$\overline{BL}$ | PL | BL/$\overline{BL}$ |
| Left | $V_{en}$ | 0 | 0 | 0 | $V_w$ | 0 | 0 | 0 |
| Right | $V_{en}$ | $V_w$ | 0 | 0 | 0 | $V_w$ | 0 | 0 |

Other non-volatile memory technologies can be substituted for the SOT-MRAM. In another embodiment, the transistors can be implemented alternatively with p-type field effect transistors (PFETs). Using PFETs, the polarities are reversed for inference and writes. In another embodiment, the SL and PL lines are swapped from rows to columns and vice versa so that the SL runs along the columns and the PL runs along the rows.

Figure 3:
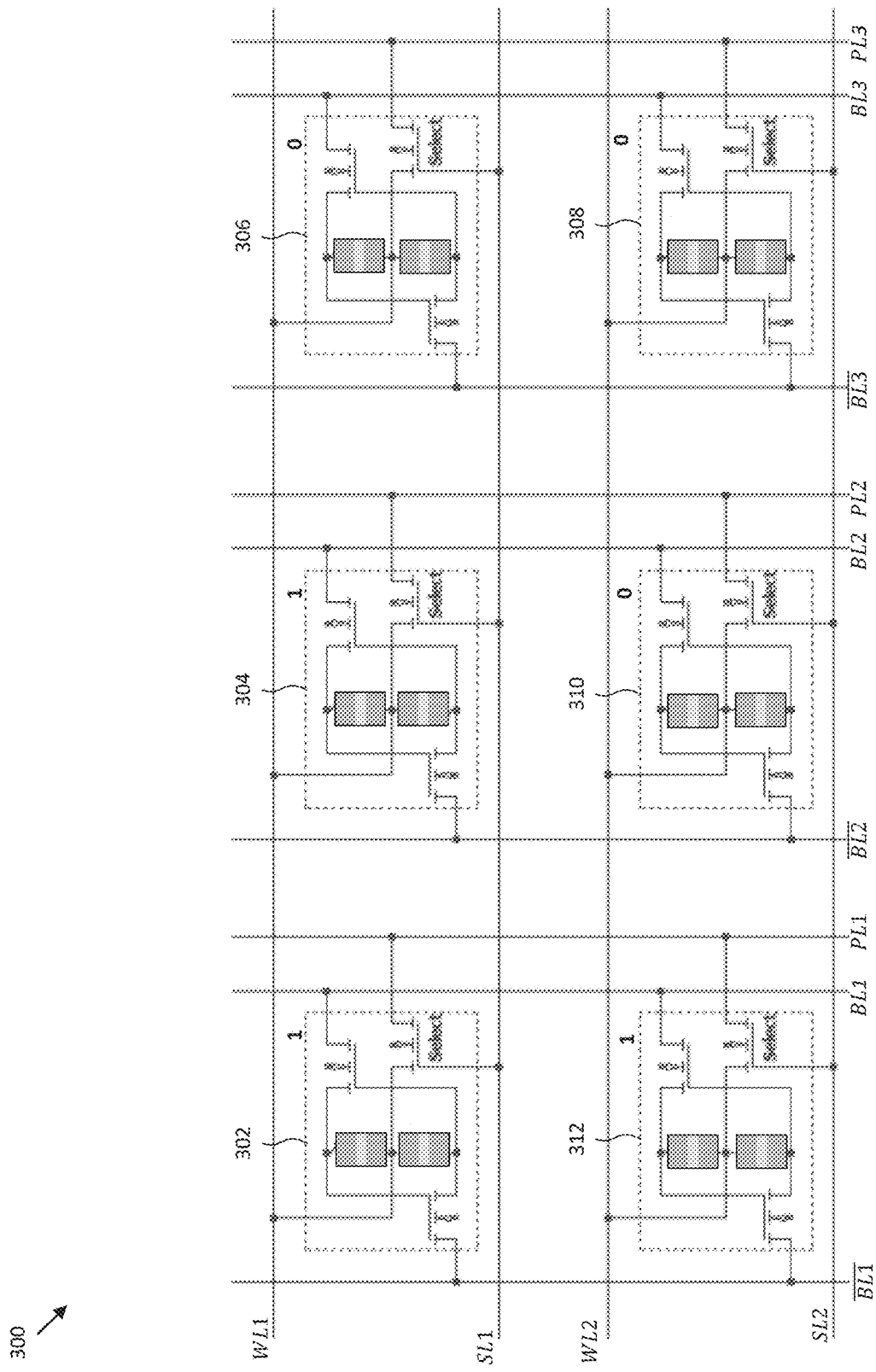
FIG. 3 illustrates a diagram of a circuit with bitcells including resistive memory elements, according to an embodiment.

FIG. 3 illustrates a diagram of a circuit with bitcells including resistive memory elements, according to an embodiment. The circuit 300 includes bitcells 302, 304, 306, 308, 310 and 312. As shown in the example of FIG. 3 and described above, three value configurations are possible. Bitcell 302 may be at value 1 and bitcell 308 may be at value 1, bitcell 304 may be at value 1 and bitcell 310 may be at value 0, and bitcell 306 may be at value 0 while bitcell 312 may be at value 0. The values, configurations and orders may vary without departing from the nature of the invention.

Figure 4:
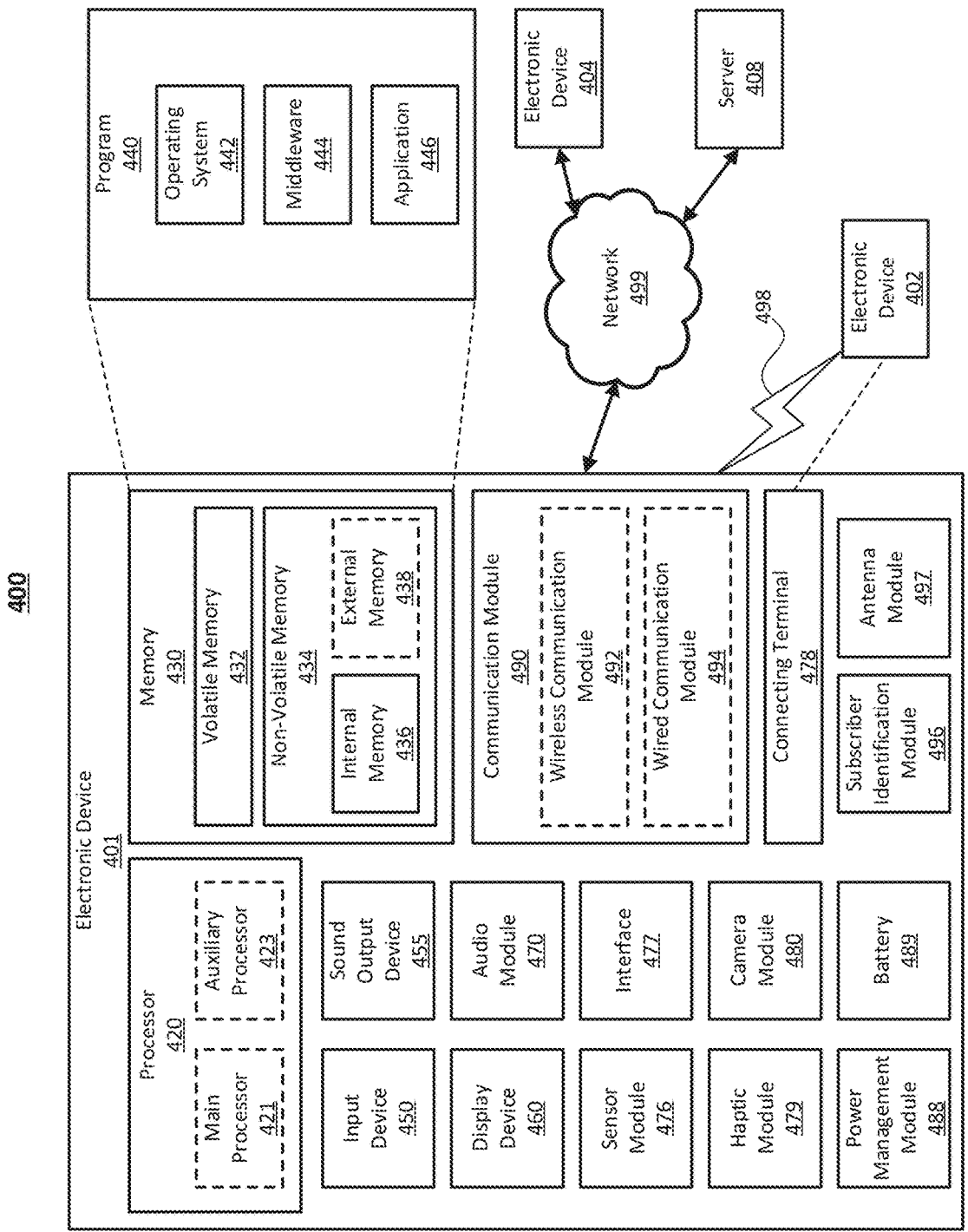
FIG. 4 illustrates a block diagram of an electronic device in a network environment, according to an embodiment.

FIG. 4 illustrates a block diagram of an electronic device 401 in a network environment 400, according to one embodiment. Referring to FIG. 4, the electronic device 401 in the network environment 400 may communicate with another electronic device 402 via a first network 498 (e.g., a short-range wireless communication network), or another electronic device 404 or a server 408 via a second network 499 (e.g., a long-range wireless communication network). The electronic device 401 may also communicate with the electronic device 404 via the server 408. The electronic device 401 may include a processor 420, a memory 430, an input device 450, a sound output device 455, a display device 460, an audio module 470, a sensor module 476, an interface 477, a haptic module 479, a camera module 480, a power management module 488, a battery 489, a communication module 490, a subscriber identification module (SIM) 496, or an antenna module 497. In one embodiment, at least one (e.g., the display device 460 or the camera module 480) of the components may be omitted from the electronic device 401, or one or more other components may be added to the electronic device 401. In one embodiment, some of the components may be implemented as a single integrated circuit (IC). For example, the sensor module 476 (e.g., a fingerprint sensor, an iris sensor, or an illuminance sensor) may be embedded in the display device 460 (e.g., a display).

The processor 420 may execute, for example, software (e.g., a program 440) to control at least one other component (e.g., a hardware or a software component) of the electronic device 401 coupled with the processor 420, and may perform various data processing or computations. As at least part of the data processing or computations, the processor 420 may load a command or data received from another component (e.g., the sensor module 476 or the communication module 490) in volatile memory 432, process the command or the data stored in the volatile memory 432, and store resulting data in non-volatile memory 434. The processor 420 may include a main processor 421 (e.g., a central processing unit (CPU) or an application processor (AP)), and an auxiliary processor 423 (e.g., a graphics processing unit (GPU), an image signal processor (ISP), a sensor hub processor, or a communication processor (CP)) that is operable independently from, or in conjunction with, the main processor 421. Additionally or alternatively, the auxiliary processor 423 may be adapted to consume less power than the main processor 421, or execute a particular function. The auxiliary processor 423 may be implemented as being separate from, or a part of, the main processor 421.

The auxiliary processor 423 may control at least some of the functions or states related to at least one component (e.g., the display device 460, the sensor module 476, or the communication module 490) among the components of the electronic device 401, instead of the main processor 421 while the main processor 421 is in an inactive (e.g., sleep) state, or together with the main processor 421 while the main processor 421 is in an active state (e.g., executing an application). According to one embodiment, the auxiliary processor 423 (e.g., an ISP or a CP) may be implemented as part of another component (e.g., the camera module 480 or the communication module 490) functionally related to the auxiliary processor 423.

The memory 430 may store various data used by at least one component (e.g., the processor 420 or the sensor module 476) of the electronic device 401. The various data may include, for example, software (e.g., the program 440) and input data or output data for a command related thereto. The memory 430 may include the volatile memory 432 or the non-volatile memory 434.

The program 440 may be stored in the memory 430 as software, and may include, for example, an operating system (OS) 442, middleware 444, or an application 446.

The input device 450 may receive a command or data to be used by other component (e.g., the processor 420) of the electronic device 401, from the outside (e.g., a user) of the electronic device 401. The input device 450 may include, for example, a microphone, a mouse, or a keyboard.

The sound output device 455 may output sound signals to the outside of the electronic device 401. The sound output device 455 may include, for example, a speaker or a receiver. The speaker may be used for general purposes, such as playing multimedia or recording, and the receiver may be used for receiving an incoming call. According to one embodiment, the receiver may be implemented as being separate from, or a part of, the speaker.

The display device 460 may visually provide information to the outside (e.g., a user) of the electronic device 401. The display device 460 may include, for example, a display, a hologram device, or a projector and control circuitry to control a corresponding one of the display, hologram device, and projector. According to one embodiment, the display device 460 may include touch circuitry adapted to detect a touch, or sensor circuitry (e.g., a pressure sensor) adapted to measure the intensity of force incurred by the touch.

The audio module 470 may convert a sound into an electrical signal and vice versa. According to one embodiment, the audio module 470 may obtain the sound via the input device 450, or output the sound via the sound output device 455 or a headphone of an external electronic device 402 directly (e.g., wired) or wirelessly coupled with the electronic device 401.

The sensor module 476 may detect an operational state (e.g., power or temperature) of the electronic device 401 or an environmental state (e.g., a state of a user) external to the electronic device 401, and then generate an electrical signal or data value corresponding to the detected state. The sensor module 476 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 477 may support one or more specified protocols to be used for the electronic device 401 to be coupled with the external electronic device 402 directly (e.g., wired) or wirelessly. According to one embodiment, the interface 477 may include, for example, a high definition multimedia interface (HDMI), a universal serial bus (USB) interface, a secure digital (SD) card interface, or an audio interface.

A connecting terminal 478 may include a connector via which the electronic device 401 may be physically connected with the external electronic device 402. According to one embodiment, the connecting terminal 478 may include, for example, an HDMI connector, a USB connector, an SD card connector, or an audio connector (e.g., a headphone connector).

The haptic module 479 may convert an electrical signal into a mechanical stimulus (e.g., a vibration or a movement) or an electrical stimulus which may be recognized by a user via tactile sensation or kinesthetic sensation. According to one embodiment, the haptic module 479 may include, for example, a motor, a piezoelectric element, or an electrical stimulator.

The camera module 480 may capture a still image or moving images. According to one embodiment, the camera module 480 may include one or more lenses, image sensors, ISPs, or flashes.

The power management module 488 may manage power supplied to the electronic device 401. The power management module 488 may be implemented as at least part of, for example, a power management integrated circuit (PMIC).

The battery 489 may supply power to at least one component of the electronic device 401. According to one embodiment, the battery 489 may include, for example, a primary cell which is not rechargeable, a secondary cell which is rechargeable, or a fuel cell.

The communication module 490 may support establishing a direct (e.g., wired) communication channel or a wireless communication channel between the electronic device 401 and the external electronic device (e.g., the electronic device 402, the electronic device 404, or the server 408) and performing communication via the established communication channel. The communication module 490 may include one or more CPs that are operable independently from the processor 420 (e.g., the AP) and supports a direct (e.g., wired) communication or a wireless communication. According to one embodiment, the communication module 490 may include a wireless communication module 492 (e.g., a cellular communication module, a short-range wireless communication module, or a global navigation satellite system (GNSS) communication module) or a wired communication module 494 (e.g., a local area network (LAN) communication module or a power line communication (PLC) module). A corresponding one of these communication modules may communicate with the external electronic device via the first network 498 (e.g., a short-range communication network, such as Bluetooth™, wireless-fidelity (Wi-Fi) direct, or a standard of the Infrared Data Association (IrDA)) or the second network 499 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 492 may identify and authenticate the electronic device 401 in a communication network, such as the first network 498 or the second network 499, using subscriber information (e.g., international mobile subscriber identity (IMSI)) stored in the subscriber identification module 496.

The antenna module 497 may transmit or receive a signal or power to or from the outside (e.g., the external electronic device) of the electronic device 401. According to one embodiment, the antenna module 497 may include one or more antennas, and, therefrom, at least one antenna appropriate for a communication scheme used in the communication network, such as the first network 498 or the second network 499, may be selected, for example, by the communication module 490 (e.g., the wireless communication module 492). The signal or the power may then be transmitted or received between the communication module 490 and the external electronic device via the selected at least one antenna.

At least some of the above-described components may be mutually coupled and communicate signals (e.g., commands or data) therebetween via an inter-peripheral communication scheme (e.g., a bus, a general purpose input and output (GPIO), a serial peripheral interface (SPI), or a mobile industry processor interface (MIPI)).

According to one embodiment, commands or data may be transmitted or received between the electronic device 401 and the external electronic device 404 via the server 408 coupled with the second network 499. Each of the electronic devices 402 and 404 may be a device of a same type as, or a different type, from the electronic device 401. All or some of operations to be executed at the electronic device 401 may be executed at one or more of the external electronic devices 402, 404, or 408. For example, if the electronic device 401 should perform a function or a service automatically, or in response to a request from a user or another device, the electronic device 401, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 401. The electronic device 401 may provide the outcome, with or without further processing of the outcome, as at least part of a reply to the request. To that end, a cloud computing, distributed computing, or client-server computing technology may be used, for example.

One embodiment may be implemented as software (e.g., the program 440) including one or more instructions that are stored in a storage medium (e.g., internal memory 436 or external memory 438) that is readable by a machine (e.g., the electronic device 401). For example, a processor of the electronic device 401 may invoke at least one of the one or more instructions stored in the storage medium, and execute it, with or without using one or more other components under the control of the processor. Thus, a machine may be operated to perform at least one function according to the at least one instruction invoked. The one or more instructions may include code generated by a complier or code executable by an interpreter. A machine-readable storage medium may be provided in the form of a non-transitory storage medium. The term "non-transitory" indicates that the storage medium is a tangible device, and does not include a signal (e.g., an electromagnetic wave), but this term does not differentiate between where data is semi-permanently stored in the storage medium and where the data is temporarily stored in the storage medium.

According to one embodiment, a method of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to one embodiment, each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In this case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. An electronic device, comprising:
   an array of weight cells, each weight cell including:
      a first resistive memory element and a second resistive memory element;
      a select transistor;
      a first transistor;
      a second transistor; and
      a layer of Spin Hall (SH) material disposed between the first resistive memory element and the second resistive memory element, the layer of the SH material including a first contact and a second contact, wherein the first contact of the SH material is connected to a drain of the select transistor and the second contact of the SH material is connected to an external word line, and wherein a pinned layer of the first resistive memory element is in connection with a drain of the first transistor and a gate of the second transistor; and
   a processor configured to perform inference with the array of weight cells by:
      setting inputs for a row of weight cells from among the array of weight cells according to a logical value of a corresponding neuron; and
      reading outputs of a column of weight cells from among the array of weight cells,
      wherein the processor is further configured to perform inference by multiplying in analog based on a potential applied to the external word line and a state of each weight cell in the array of weight cells.

2. The electronic device of claim 1, wherein a product of the multiplication is an analog current on an output line and a controlled complimentary output line.

3. The electronic device of claim 1, wherein the first resistive memory element includes a free layer and a pinned layer, and the second resistive memory element includes a free layer and a pinned layer.

4. The electronic device of claim 3, wherein the layer of SH material is disposed between the free layer of the first resistive memory element and the free layer of the second resistive memory element.

5. The electronic device of claim 1, wherein the first resistive memory element and the second resistive memory element comprise magneto tunnel junctions (MTJs).

6. The electronic device of claim 1, wherein the select transistor comprises an n-type field effect transistor (FET).

7. The electronic device of claim 1, wherein the select transistor comprises a p-type field effect transistor (FET).

8. The electronic device of claim 1, wherein the first resistive memory element and the second resistive memory element comprise resistive random access memory (RRAM) elements.

9. The electronic device of claim 1, wherein the first resistive memory element and the second resistive memory element comprise SH-based magnetic random access memory (MRAM) elements.

10. A device, comprising:
    an array of weight cells, each weight cell including:
       a first resistive memory element and a second resistive memory element;
       a select transistor;
       a first transistor;
       a second transistor; and
       a layer of Spin Hall (SH) material disposed between the first resistive memory element and the second resistive memory element, the layer of the SH material including a first contact and a second contact, wherein the first contact of the SH material is connected to a drain of the select transistor and the second contact of the SH material is connected to an external word line, and wherein a pinned layer of the second resistive memory element is in connection with a drain of the second transistor and a gate of the first transistor; and
    a processor configured to write to the resistive memory elements according to a direction of a supplied current, wherein the processor is configured to write to the resistive memory elements by setting a word line of a column to a predetermined voltage and holding remaining word lines in the array of weight cells to ground.

11. The device of claim 10, wherein the first resistive memory element is in a high resistance state and the second resistive memory element is in a low resistance state when the current is supplied to the SH material layer in a left direction.

12. The device of claim 10, wherein the first resistive memory element is in a low resistance state and the second resistive memory element is in a high resistance state when the current is supplied to the SH material layer in a right direction.

13. The device of claim 10, wherein the first resistive memory element includes a free layer and a pinned layer, and the second resistive memory element includes a free layer and a pinned layer.

14. The device of claim 13, wherein the layer of SH material is disposed between the free layer of the first resistive memory element and the free layer of the second resistive memory element.

15. The device of claim 10, wherein the first resistive memory element and the second resistive memory element comprise magneto tunnel junctions (MTJs).

16. The device of claim 10, wherein the select transistor comprises an n-type field effect transistor (FET).

17. The device of claim 10, wherein the select transistor comprises a p-type field effect transistor (FET).

18. The device of claim 10, wherein the first resistive memory element and the second resistive memory element comprise resistive random access memory (RRAM) elements.

19. The device of claim 10, wherein the first resistive memory element and the second resistive memory element comprise SH-based magnetic random access memory (MRAM) elements.

* * * * *